United States Patent [19]

Chilton et al.

[11] 4,195,871
[45] Apr. 1, 1980

[54] DIFFUSION BOAT AND GRIP

[75] Inventors: George E. Chilton, Haworth; John Kudla, Colonia, both of N.J.

[73] Assignee: Codi Corporation, Fair Lawn, N.J.

[21] Appl. No.: 914,972

[22] Filed: Jun. 12, 1978

[51] Int. Cl.² .............................................. B65D 25/28
[52] U.S. Cl. .................................................... 294/16
[58] Field of Search ............... 294/34, 16, 26.5, 27 R, 294/27 H, 31.2, 87 R; 224/48 A, 48 B; 206/328, 316, 445, 334

[56] References Cited

U.S. PATENT DOCUMENTS

| | | | |
|---|---|---|---|
| 3,861,733 | 1/1975 | Mey | 294/16 |
| 3,923,191 | 12/1975 | Johnson | 294/16 |

*Primary Examiner*—James B. Marbert
*Attorney, Agent, or Firm*—Darby & Darby

[57] ABSTRACT

A tool is disclosed for gripping an elongated transport or diffusion boat having a concave surface extending from end to end which is grooved repeatedly in one direction to support each of a plurality of disc like semiconductor wafers peripherally in vertical side-by-side relationship. Each end of the boats is provided with a pair of horizontally aligned spaced apart notches. The tool for gripping the boat consists of a pair of spaced apart parallel arm members each of which carries a pair of linearly aligned finger sections adapted for removable insertion into the notches. Means are provided to move the arm members laterally toward each other thereby to insert the fingers simultaneously into all of the notches to grip the boat.

18 Claims, 4 Drawing Figures

DIFFUSION BOAT AND GRIP

BACKGROUND OF THE INVENTION

The present invention relates to jigs used in transporting semiconductor wafers undergoing heat processing and in particular to a tool used for gripping a transport jig in manipulating the jig and its cargo of semiconductor wafers prior to or subsequent to the application of heat processing techniques.

As the size and component density of semiconductor devices increases, microscopic defects and errors inconsequential only a few years ago assume an increasing technical and economic significance. One of the subtle sources of contamination in silicon wafers is the jig or diffusion boat utilized in transporting the wafers through the traditional heat-processing steps. Such contamination can arise either because of the material employed in construction of the jig or in the techniques for handling the jig during processing.

Such processing of silicon wafers generally includes steps of placing a plurality of wafer-bearing jigs or diffusion boats end to end upon the upper surface of an elongated wheeled paddle element. The paddle element is thereafter rolled into an appropriate furnace such as a diffusion tube for heating.

Heretofore it has been extremely difficult to emplace, remove or otherwise manipulate just one of a plurality of diffusion boats aligned end to end for presentation to the furnace. The boats have not been designed to permit nor has a proper tool been available for individual manipulation thereof either after they have been aligned in end to end relationship or in so placing them on the furnace paddle. Neither the boats nor the tool used for carrying them have heretofore been designed for efficient handling which maximizes the opportunity for carrying the boats efficiently and minimizes any scraping against the surface of the jig by the tool as the latter is moved into gripping contact.

SUMMARY OF THE INVENTION

The present invention obviates these and other difficulties with the prior techniques in providing a diffusion boat having a pair of horizontally linearly aligned spaced apart notches formed in each end thereof and a tool for gripping the boat in the notches having a plurality of gripping finger sections, one for each notch. The tool generally consists of a pair of spaced apart parallel extending arm members operably interconnected for motion back and forth toward and away from each other. The arms are biased outwardly to a predetermined spacing just slightly larger than the length of one of the diffusion boats. The finger sections are preferably formed as part of a header portion of an inverted substantially T-shaped element depending from adjacent the distal end of each of the movable arms. The arms are interconnected through a motion-translating mechanism which converts pivotal movement of a pair of grips into the substantially linear back-and-forth movement of the arms described above. Portions of each end of the transport boat outside of or above the notches are offset inwardly relative to the remainder of the end between the notches thereby defining a central abutment surface between the notches which assists in aligning the boats relative to each other on the upper surface of the wheeled paddle. The fingers are rotatably mounted on the header portion to roll along the jig surfaces and into the notches thereby to avoid scraping and its attending likelihood of particle contamination.

The diffusion boats are aligned end-to-end on a wheeled paddle element which carries them into the furnace. The notches opposite one another on opposite ends the boats are also horizontally aligned so that corresponding notches on juxtaposed end portions of adjacent boats are aligned to define slots therebetween open at the top to permit entry of the finger sections of the gripping tool. In this way the notches permit the boats to be aligned end to end with the ability to remove individual ones from the alignment when desired.

BRIEF DESCRIPTION OF THE DRAWINGS

For a further understanding of the present invention, reference may be had to accompanying drawings in which.

BRIEF DESCRIPTION OF THE PREFERRED EMBODIMENT

Figure 1:
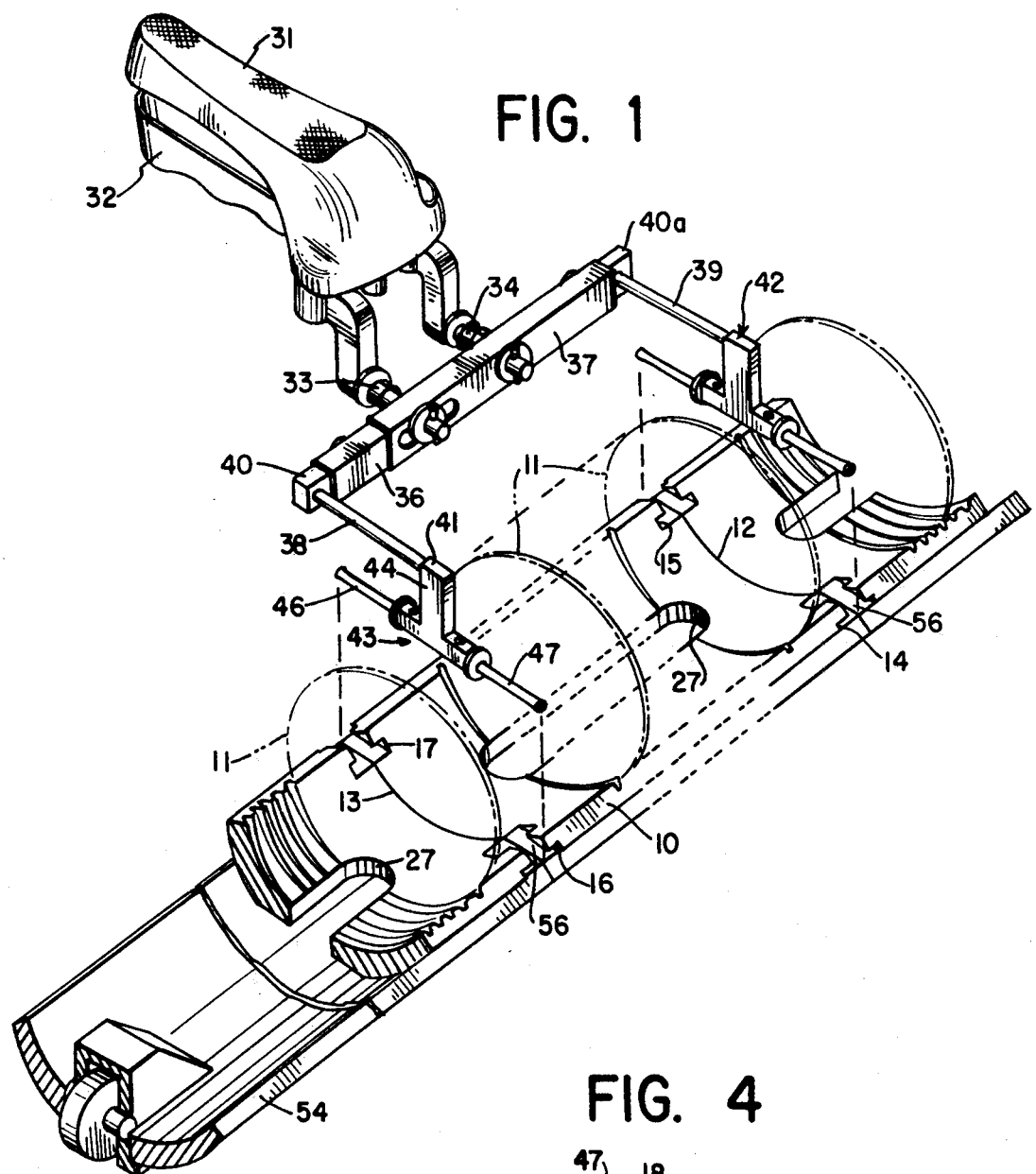
FIG. 1 is a perspective view of a tool constructed in accordance with the present invention being inserted to grip one of a plurality of diffusion boats aligned end to end on a wheeled furnace paddle.
Figure 2:
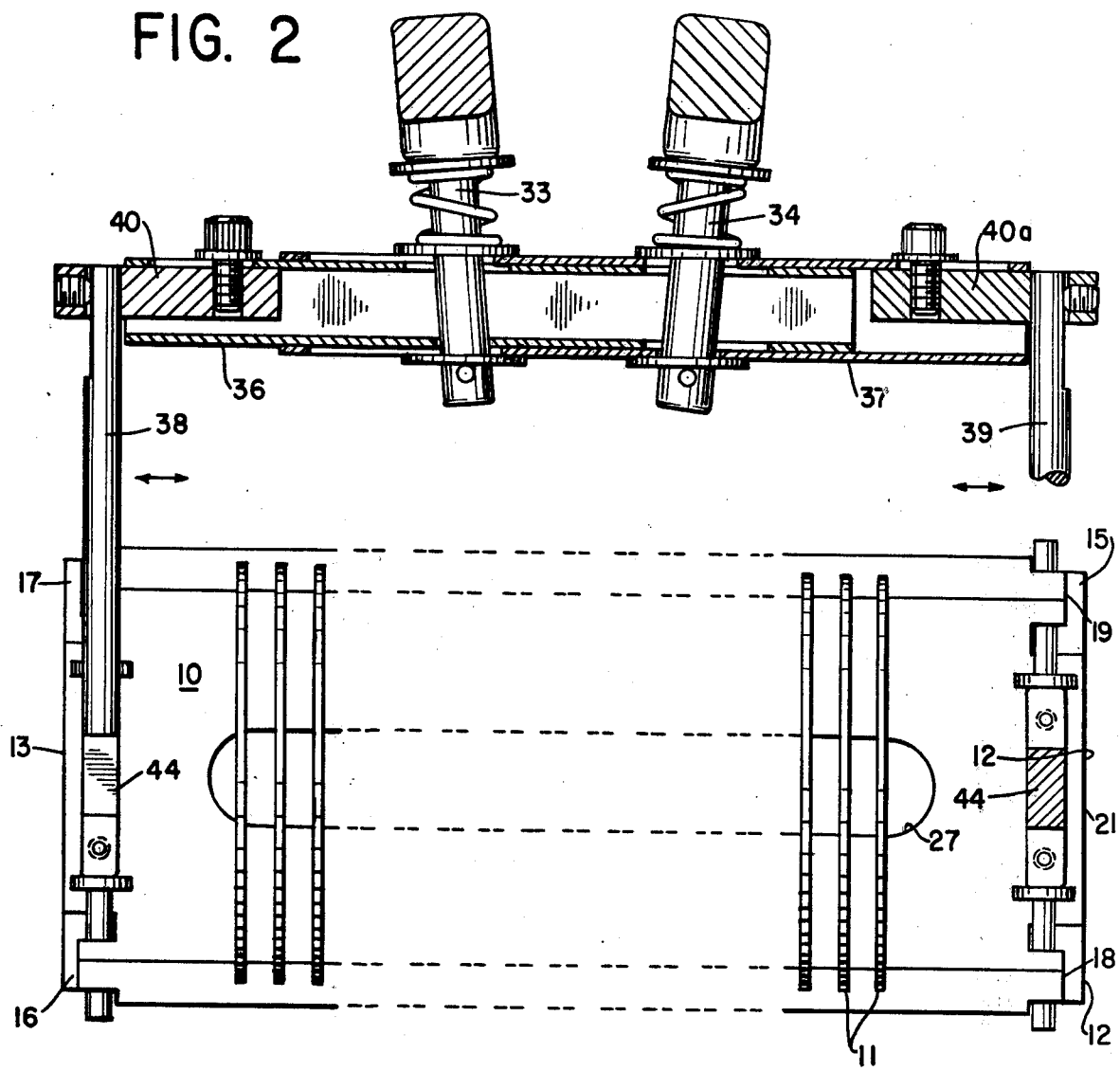
FIG. 2 is a top plan view of the tool of FIG. 1 actually gripping one of the diffusion boats and showing the details of the tool construction.

Referring now to the drawings and in particular to FIGS. 1 and 2, there is illustrated a jig 10 for holding a plurality of silicon wafers during heat processing and consisting of a generally rectangular body portion which is curved laterally to form a concave surface on what is commonly referred to as a diffusion boat. The size of the diffusion boat may vary as desired. The present embodiment depicts an approximately one-third round unit, although larger diffusion boats supporting a greater proportion of the periphery of the wafers might be employed if necessary or desirable.

The jig or diffusion boat 10 contains a plurality of laterally extending or radial grooves 11 formed side by side in a pattern covering a portion of the length of the structure. The grooves 11 are each adapted to hold a generally circular silicon wafer in a generally vertical position for heat processing in accordance with well known semiconductor processing techniques. Wafers so situated in adjacent grooves are retained in spaced apart relationship to minimize any danger of their contaminating one another by mutual contact. For large diameter silicon wafers adequate peripheral support for the wafer may be achieved with half round rather than one-third round jigs and such an enlargement of the boat 10 does not depart from the scope of the present invention.

The diffusion boat 10 is preferably constructed of polycrystalline vapor deposited CVD silicon material. The CVD silicon is known for its purity and commercial availability. Its thermal expansion characteristics are nearly precisely matched with those of the silicon wafers to be held for heat processing. The diffusion boats are preferably machined out of a single piece of silicon thereby enabling tight tolerance of the relatively closely spaced slots or grooves 11 without running any risk that silicon wafers held in position thereby come into contact with each other during processing. The boats may, for example, be made from cylinders of pure silicon cut into three pieces to form three one-third round diffusion boats. The boats are then machined to form the grooves 11. Other advantages in the use of silicon for the diffusion boat 10 will be apparent to those skilled in this art.

Figure 4:
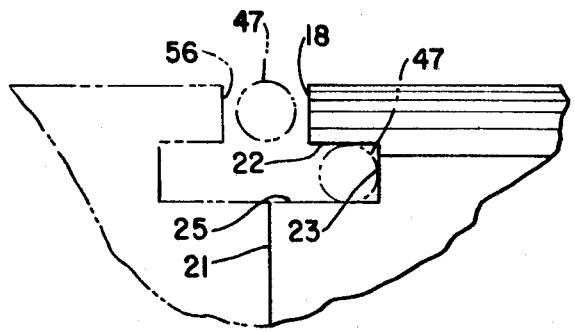
FIG. 4 is a cutaway view showing the details of the diffusion boat notch construction.
Figure 3:
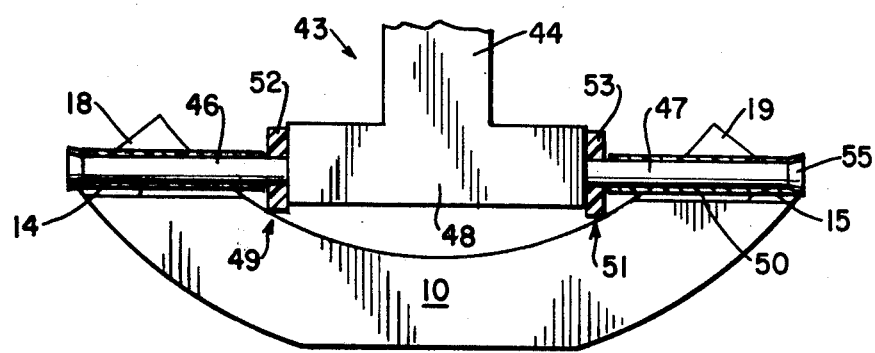
FIG. 3 is a view taken along the line 3—3 of FIG. 2.

In accordance with the invention, opposite ends 12 and 13 of the diffusion boat 10 are provided respectively with identical sets of suitable notches 14, 15 and 16, 17 to enable the boat along with its supply of silicon wafers to be gripped with a special tool described in detail below. Since the sets of notches are identical on each of the ends 12 and 13, only one such set need be described herein in detail. With reference to FIGS. 2 and 3, the notches 14 and 15 for example, are generally horizontally linearly aligned along a secant of the curved outline defined by the concavity of the boat structure. In particular the notches are aligned in a plane perpendicular to a radial bisector of the concave surface of the boat. Portions 18 and 19 of the end 12 forming one side of each of the notches 14 and 15 respectively and defining the corners of the boat are offset by a predetermined amount longitudinally inwardly relative to the remaining section 21 between the notches as shown in FIG. 4. The amount of such offset is preferably at least one-half the width of the notch.

Referring to FIG. 4, each of the notches 14 and 15 defines a flat generally horizontal overlying ledge portion 22 and a flat, generally vertical inner wall 23 adjoining a generally flat base section 25. The width of the notch is measured between the ledge 22 and the base section 25. The way in which the four notches are used to enable a fully loaded boat to be lifted with only a minimal risk of contamination of the semiconductor wafers is described below.

In the preferred embodiment, the diffusion boat has a longitudinal generally horizontal flat 24 formed approximately at the middle of its convex surface 26 (FIG. 3) thereby to facilitate stability during processing of a load of semiconductor wafers. The boat may also be formed with a central longitudinal slot 27 advantageously to reduce its thermal mass.

A tool 30 which may be used to grip the diffusion boat to move it into or out of processing alignment with other similar boats is illustrated in FIGS. 1 and 2. It consists of a pair of pivotally connected hand grips 31 and 32 movable back and forth in one direction relative to each other in a scissors-type action. The grips 31 and 32 are connected through a known type of motion translating mechanism to a pair of generally horizontally extending arms 33 and 34. The motion translating mechanism essentially converts the scissors movement in one direction (generally vertical) of the grips 31 and 32 into motion back and forth in a direction perpendicular to the one direction (generally horizontal) of the arms 33 and 34. In the present embodiment at least one of the arms 33 and 34 pivots or is pinched slightly toward the other in the generally horizontal direction. This is simply a function of the particular motion translating mechanism selected for the tool. The invention of course is not to be limited to that extent.

Each of the arms 33 and 34 is rigidly connected respectively to one of a pair of concentrically slidable carriage elements 36 and 37. One of the elements, for example the element 37, is at least partially hollow, its internal diameter being only slightly larger than the external diameter of the other element so as to accommodate the latter concentrically in a snug but relatively slidable fit. The arms 33 and 34 may be connected to the carriage elements 36 and 37 in any convenient but rigidly secure fashion. Upon pivotal movement of the scissor grips 31 and 32, the carriage elements 36 and 37 slide longitudinally or linearly back and forth relative to each other one within the other. While the carriage elements are shown to have a somewhat angular or square cross-sectional configuration, they may be tubular and both may be hollow if desired.

Outwardly protruding rods 38 and 39 are each rigidly connected at one end to the outer end of one of the carriage elements to move therewith. The rods extend in the same direction perpendicular to the carriage elements and parallel to each other. In the present embodiment, the rods are also substantially parallel to the arms 33 and 34, although this arrangement may be altered without departing from the scope of the invention. It is important however, that the rods extend in the same direction parallel to each other. As a result of its rigid interconnection with one of the two carriage elements 36 and 37, each of the rods is movable back and forth in the direction indicated by the arrows shown in FIG. 2, generally sidewise with respect to its longitudinal dimensions.

In the preferred embodiment, each of the rods is rigidly connected to a slider member 40 and 40a which is concentrically fitted to the outer end of each of the carriage elements so as to slide longitudinally back and forth relative thereto. In the present arrangement, the sliders fit concentrically within hollow openings at each end of the associated carriage element. A set screw may be utilized to fix the sliders into a predetermined position relative to the carriage elements. In this way the spacing between the rods 38 and 39 may be adjusted to accommodate diffusion jigs or boats of varying dimensions.

Referring to FIGS. 1 and 3 each of a pair of similar generally inverted T-shaped couplings 41 and 42 may depend from the distal end of each of the rods 38 and 39. The T-shaped couplings are non-rotatably connected to their respective rods and each consists of a header portion, generally indicated by reference numeral 43, and a medial leg 44. For each of the T-shaped couplings, the header 43 consists of a pair of dowel-like fingers 46 and 47 extending in opposite directions and generally aligned with each other and with their corresponding supporting rod. Accordingly, the fingers 46 and 47 of each of the T-shaped couplings are moved sideways along with their respective rods upon relative sliding movement of the carriage elements 36 and 37. In the present embodiment, the tool is adjusted so that upon compression of the scissors-type grips 31 and 32, the carriage elements 36 and 37 along with their respective T-shaped couplings are moved relatively inwardly toward each other.

Of course the invention is not to be limited to the T-shaped coupling defining the fingers 46 and 47. The fingers may be formed as part of sections of a continuous bar otherwise carried by each of the rods 38 and 39 in any suitable fashion.

The motion translating mechanism of the present tool is preferably adjusted so that the carriage elements and rods are normally biased apart. In that relaxed position the couplings 41 and 42 are spaced apart by a distance substantially equal to the longitudinal dimension of the diffusion boat 10. The distance between the outer ends of each associated pair of fingers 46 and 47 is approximately coextensive with the linear distance between the notches across the diffusion boat 10. The fingers 46 and 47 are preferably constructed of or covered by a layer of an organic material such as Teflon or similar material in order to minimize any possibility of contaminating the silicon of the diffusion boat upon contact therewith.

In the present embodiment, each of the fingers is covered by a layer 50 (FIG. 3) of teflon in the form of a cylindrical sleeve. The internal diameter of the teflon sleeve relative to the finger is such that the sleeve is free to rotate on the finger. The sleeve 50 may be held in place by a small annular rib 55 formed at the outer end of the finger. Alternatively, the sleeve may be fixed to each of the fingers and the fingers themselves are rotatably connected to their respective header portions.

The purpose of this rotational movement capability in the fingers is to avoid to the extent possible, any scraping of the fingers against the diffusion boat during manipulation of the latter with the tool. A rolling engagement between the fingers and the boat is not quite so likely to generate subtle particulate contamination of the silicon wafers being processed.

The tool is used of course to grip and to lift one of the diffusion boats 10. As shown in FIG. 1, the couplings 41 and 42 are brought down over the boat until each of the fingers 46 and 47 of each coupling is placed in position adjacent one of the four notches 14–17. In this position the scissors grips 31 and 32 are squeezed together to cause the carriage elements 36 and 37 to be moved together. This causes the fingers to be moved into their respective notches on the diffusion boat until they abut against the inner walls 23 of each of the notches. In this position, as shown in FIG. 2 and in phantom in FIG. 4, the fingers are beneath the overlying ledge 22 described above and as long as the fingers are held in this inward position the boat may be lifted on the fingers and carried by way of the tool. The diffusion boat may be held by the tool as long as the scissors grip is depressed. Upon release of the grips 31 and 32, the carriage elements are moved outwardly under the pretensioned bias and the fingers are thereby released from their respective notches.

To facilitate alignment of the fingers with the corresponding notches prior to insertion therein, each of the headers 43 may be provided with an enlarged diameter portion 48 having a pair of spaced apart shoulders 49 and 51 interposed between the fingers 46 and 47. The diameter of the enlarged portion 48 of the header at each of the shoulders is such that when the shoulders engage the concave curved surface of the diffusion boat the fingers are in alignment with the notches. In the present embodiment the shoulders 49 and 51 each consists of a disc-like teflon member 52 and 53 respectively preferably rotatably affixed to opposite ends of the enlarged portion 48 of the header. The teflon material is selected for this purpose since it minimizes the potential for contamination of the silicon wafers carried by the boat when the tool is being used. In particular, the teflon shields against metal contact with the pure silicon boat. In dealing with the degree of purity required for producing silicon wafers of the type described herein it is best to avoid any metal contact with the silicon boat. Any teflon which which might be rubbed off during manipulation of the boat with the tool is organic and dissipates during the subsequent heat processing step.

During the heat processing step in semiconductor wafer manufacture, a plurality of wafer bearing diffusion boats is assembled together on a wheeled paddle member 54, as shown in FIG. 1. The boats are positioned end to end on the paddle such that the protruding sections 21 between the notches abut together. In this position the offset portions 18 and 19 of each boat define a plurality of spaced apart gaps 56 in the otherwise continuous periphery of the aligned boats. The gaps are located at the junctures between adjacent boats and are aligned one across from the other on each side of the train of boats assembled together on the paddle 54.

With reference to FIG. 4, the diameter of each of the fingers and its sleeve must be at most just slightly less than the vertical width of the corresponding notches formed in the diffusion boat. In addition, the finger sections and sleeves cannot be larger than twice the amount of the offset defining the portion 18 and 19 and thus the gaps 56 when the boats are aligned end-to-end. Accordingly the finger sections 47 are appropriately dimensioned to fit into the gaps 56, as shown in phantom, and thereafter into their respective notches when a boat forming one of an end to end alignment of similar boats is to be gripped thereby.

Any individual boat and its supply of wafers may be removed from the paddle simply by inserting the fingers 46 and 47 of the tool 30 into a corresponding gap on each side of the boat so that the shoulders 49 and 51 press against the concave surface of the boat. The fingers are then properly aligned just outside the notches 14–17 for insertion therein upon depressing of the hand grips 31 and 32 as described above.

It will be understood that various modifications and adaptations of the foregoing device might be made by persons skilled in the art without departing from the scope of the invention. The invention therefore is not to be limited except as defined in the appended claims.

What is claimed is:

1. A tool for gripping an elongated transport device having a concave surface extending from end to end and grooved repeatedly to support peripherally each of a plurality of disc-like semiconductor elements, each end of the device having a pair of spaced apart notches aligned linearly perpendicular to a radial bisector of said surface, the tool comprising a pair of spaced apart parallel extending arm members operably interconnected to be movable back and forth toward and away from each other to respective actuated and unactuated positions, the movement of said arm members being substantially linear as they approach said actuated position, a pair of oppositely extending and linearly aligned finger sections carried by each of said arm members, each of said finger sections being adapted to be inserted into one of the notches, means for moving the arm members laterally toward each other thereby to insert said fingers simultaneously into the notches to grip the transport device, and stop means interrupting movement of said arm members for establishing the distance between said arm members at predetermined values for each of said actuated and unactuated positions.

2. The tool of claim 1 comprising an inverted substantially T-shaped element depending from adjacent the distal end of each of said arms and having a header portion, said fingers being connected to opposite ends of said header portion.

3. The tool of claim 1 in which each of said arm members is connected to one of a pair of carriage shafts concentrically arranged to slide relatively back and forth relative to each other in a direction perpendicular to the arm members.

4. The tool of claim 3 in which said moving means comprises a pair of pivotally interconnected hand grips and means interconnecting the grips and said shafts for translating pivotal movement of the grips into relative sliding movement of said shafts thereby to induce said arm members to be moved toward and away from each other upon pivotal movement of the hand grips.

5. The tool of claim 2 in which said header portion comprises a pair of spaced apart shoulder portions adapted to contact that portion of the boat between said notches to align said fingers for insertion therein.

6. The tool of claim 5 in which each of said shoulder portions is covered with a layer of teflon for engagement with the silicon boat.

7. The tool of claim 6 in which each of said shoulder portions comprises a disc-like element rotatably mounted on said header portion.

8. The tool of claim 1 in which said fingers are rotatably mounted to roll into the notches on the transport device.

9. The tool of claim 8 in which said fingers comprise a fixed shaft surrounded by a rotatably mounted sleeve of teflon.

10. A transport device for use in heat processing of a plurality of disc-like semiconductor elements, said device having a concave surface extending from end to end and provided with a plurality of adjacent grooves laterally traversing the transport in one direction to support each of the semiconductor elements peripherally in generally vertical side by side relationship to each other, the improvement comprising a plurality of notches formed in opposite end portions of the transport, each end having a spaced apart pair of said notches linearly aligned perpendicular to a radial bisector of the concave surface, portions of each end of the transport forming one side of each of said notches being offset inwardly relative to the remainder of the end between the notches to define an abutment surface between the notches for aligning the transport end to end relative to other adjacent transports during heat processing of the semiconductor elements.

11. The device of claim 10 in which the transport is provided with four of said notches.

12. The device of claim 10 in which each of said notches extends inwardly relative to the transport in a direction generally perpendicular to said one direction.

13. The device of claim 10 in which the transport is constructed of polycrystalline silicon material.

14. The device of claim 10 in which the transport has a longitudinally extending flat surface opposite the concave surface defining a plane generally perpendicular to said radial bisector of the concave surface.

15. A tool for gripping a transport device as defined in claim 10 comprising a pair of spaced apart parallel extending arm members operably interconnected so as to be movable back and forth toward and away from each other, the improvement comprising an inverted substantially T-shaped element depending from each of the arm members and having a header portion parallel to the arm members and including a pair of linearly aligned and oppositely extending fingers each of which is adapted to be inserted into one of the notches of the transport, and means for moving the arm members laterally toward each other to insert said fingers simultaneously into said notches to grip the transport.

16. The transport device of claim 10 in which all of said notches are coplanar in a plane perpendicular to said radial bisector for the concave surface.

17. The transport device of claim 10 in which the amount of said offset for each of said notches is at least one-half the width of the notch.

18. The transport device of claim 1 in which the diameter of each of said finger sections is at most slightly less than the width of a corresponding notch.

* * * * *